United States Patent
Shaw et al.

(10) Patent No.: US 6,885,487 B2
(45) Date of Patent: Apr. 26, 2005

(54) PACKAGING FOR OPTICAL TRANSCEIVER MODULE

(75) Inventors: Cheng-Da Shaw, Changhua Hsien (TW); Min-Sheng Kao, Taipei Hsien (TW); Chiung-Hung Wang, Taoyuan Hsien (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 10/617,837

(22) Filed: Jul. 14, 2003

(65) Prior Publication Data

US 2004/0008954 A1 Jan. 15, 2004

Related U.S. Application Data

(63) Continuation of application No. 10/200,185, filed on Jul. 23, 2002, now Pat. No. 6,661,565.

(30) Foreign Application Priority Data

Mar. 26, 2002 (TW) ........................................ 91105834 A (51) Int. Cl.[7] ............................. G02F 1/03; H01L 29/06
(52) U.S. Cl. ....................... 359/237; 359/238; 359/244; 257/81; 257/82
(58) Field of Search ................................. 359/237, 238, 359/244, 152, 297; 385/92; 257/81, 82, 684, 685, 696

(56) References Cited

U.S. PATENT DOCUMENTS 6,497,518 B1 * 12/2002 Deane .......................... 385/92
2001/0030789 A1 * 10/2001 Jiang et al. .................. 359/152

* cited by examiner

*Primary Examiner*—Timothy Thompson
(74) *Attorney, Agent, or Firm*—Birch, Stewart, Kolasch & Birch, LLP (57) ABSTRACT

A packaging method of the optical transceiver module for transmitting optical signals is disclosed. The invention includes a base, a case, a transmission unit and receiving unit. The transmission unit and the receiving unit contain a circuit board, respectively. The base provides two fixing positions for the installation of the two circuit boards. The two circuit boards are installed horizontally and vertically, respectively. This design increase the utilization of the inner space providing ideal shielding for the elements and circuit boards. A central beam is used to fix the structure and case in a drawable way like a matchbox. This reduces covered area of the circuit board, making the elements easy to be tested and assembled.

24 Claims, 7 Drawing Sheets

PACKAGING FOR OPTICAL TRANSCEIVER MODULE

This is a continuation of application Ser. No. 10/200,185, filed Jul. 23, 2002, now U.S. Pat. No. 6,661,565.

The present application claims, under 35 U.S.C. § 119, the priority benefit of Taiwan Patent Application No. 91105834 filed Mar. 26, 2002, the entire contents of which are herein fully incorporated by reference.

BACKGROUND OF THE INVENTION

1. Field of Invention

The invention relates to an optical transceiver packaging for receiving and transmitting optical signal. More particularly, the invention pertains to an optical transceiver packaging convenient for manufacturing and assembly.

2. Related Art

Figure 1:
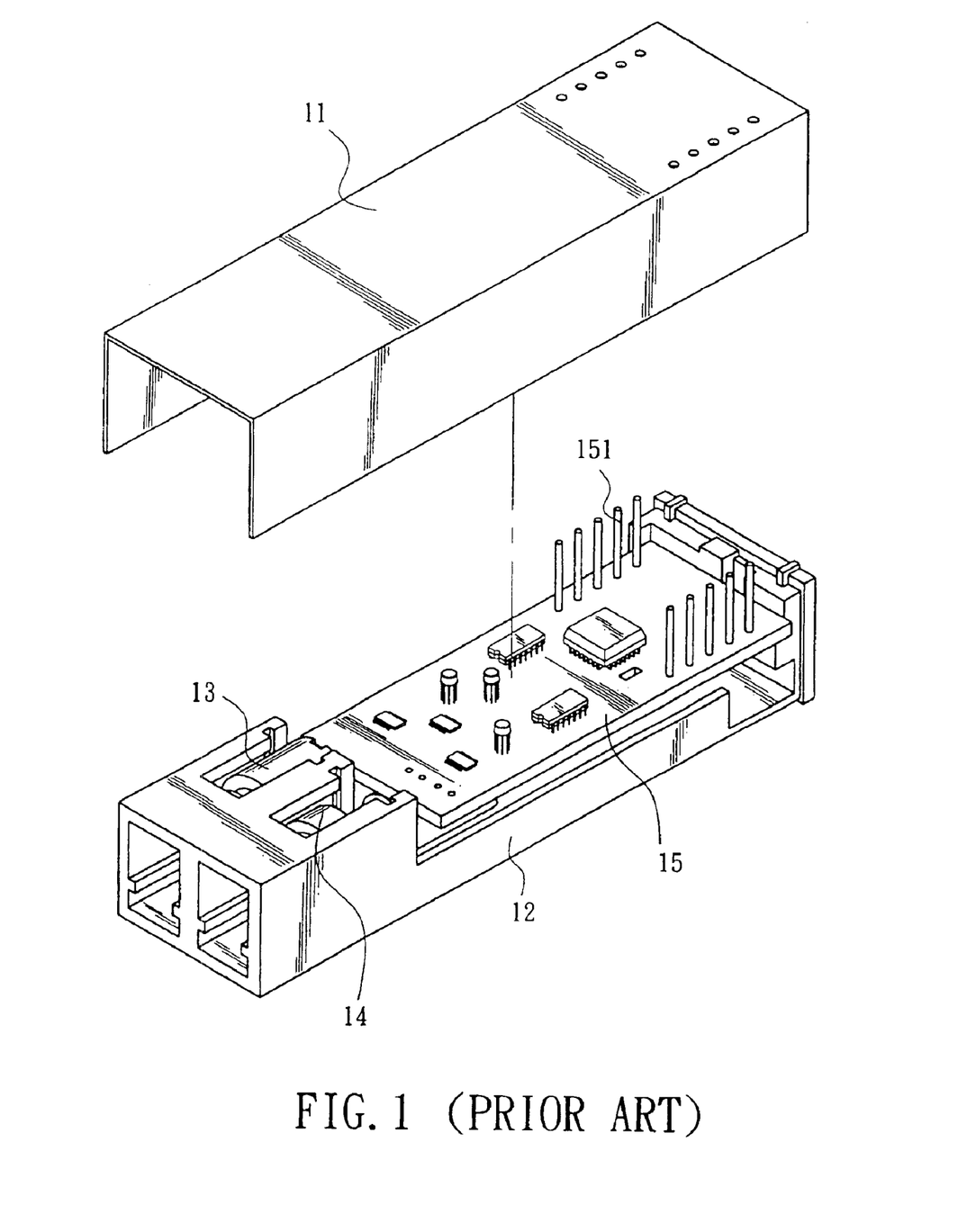
FIG. 1 is a schematic view of a packaging of an optical transceiver module in the prior art.

The optical transceiver module is installed in an electronic device to emit or receive optical signals through optic fibers. Basically, the optical transceiver module has a case 11, a base 12, a receiver optical subassembly (ROSA) 13, a transmitter optical subassembly (TOSA) 14, and a circuit board 15. With reference to FIG. 1, the base 12 supports the circuit board 15, and the case 11 covers the base 12. The circuit board 15 has the functions of transmitting/receiving electrical signals to/from TOSA/ROSA. The circuit board 15 is connected to the electronic device through its pins 151 so that the electronic device can transmit and receive optical signals via its transceiving terminal.

The circuit board 15 is parallel to the base 12, with the emitter 14 and the receiver 13 installed on its front end for connecting with optic fibers. Since the circuit board 15 has both functions of transmission and reception, it is likely to have crosstalks, deteriorating the signal quality. Any error occurred to the circuit cannot be easily attributed to the reception or transmission. Furthermore, the elements on the circuit board 15 are limited by the size of the circuit board 15 to be placed fairly close to one another, resulting in serous crosstalk.

Figure 2:
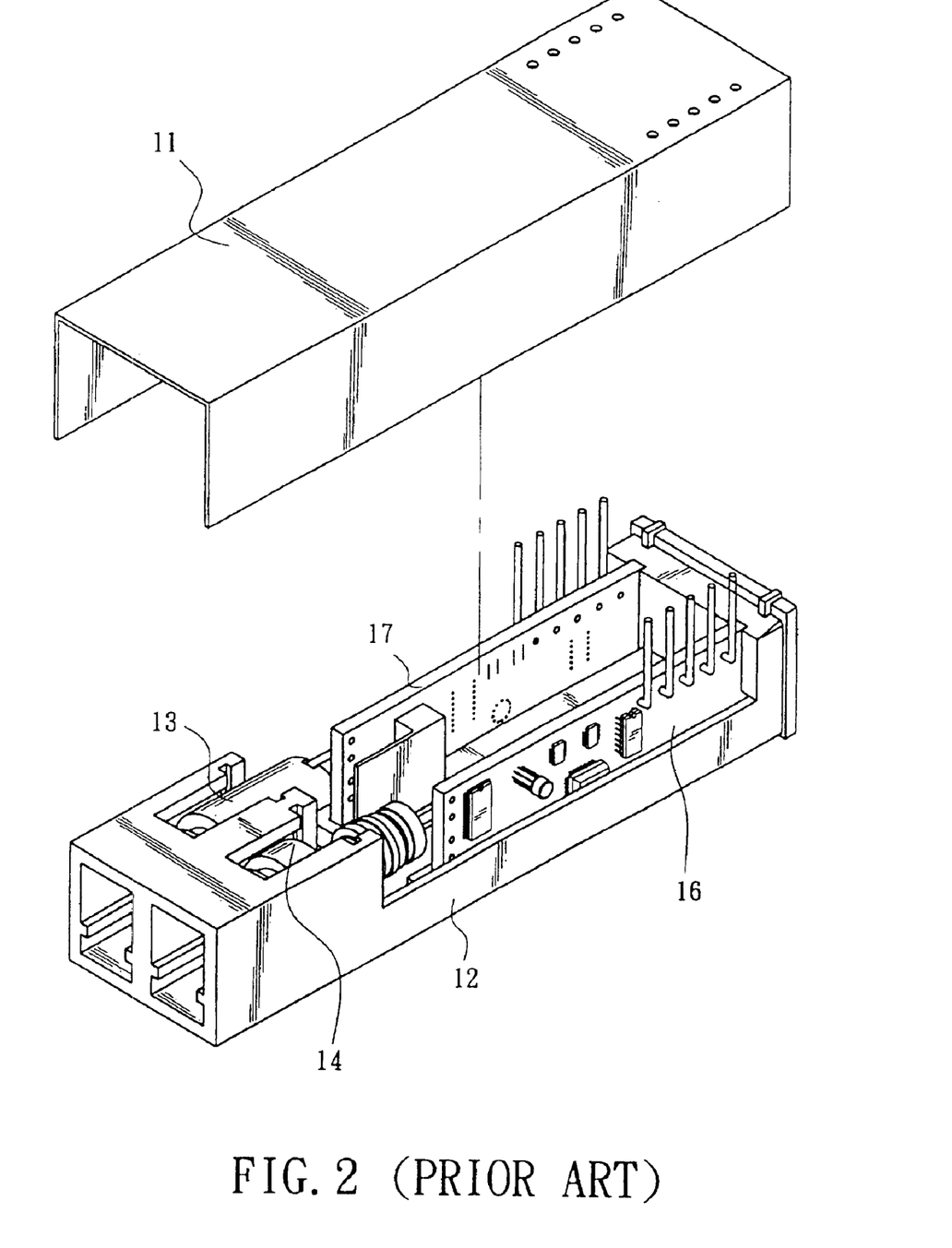
FIG. 2 is a schematic view of another packaging of an optical transceiver module in the prior art.

To solve the problem of crosstalks, the prior art has the functions of transmission and reception separately on two independent circuit boards. As shown in FIG. 2, the two circuit boards 16, 17 have the functions of transmitting and receiving optical signals and connect to the transmitter 14 and the receiver 13, respectively. This can reduce the problem of crosstalks. Moreover, once any error occurs to the system, one can easily identify where the problem is. However, since the two circuits 16, 17 are installed in parallel, an extra shielding design is needed to completely solve the crosstalk problem. As the whole optical transceiver module is small and the two circuit boards 16, 17 are shielded from each other, the circuit board assembly and its element testing and debugging are limited by the span of the two circuit boards.

SUMMARY OF THE INVENTION

The invention provides a packaging method for the optical transceiver module. It can solve the problems of EMI and crosstalks. The invention also efficiently utilizes the inner space of the module to achieve the goals of easy assembly, tests and manufacturing.

The disclosed packaging method for the optical transceiver module includes a base, a transmission unit, a receiving unit, and a case. The receiving unit and the transmission unit contain a circuit board, respectively. The base has two fixing positions for the installation of the two circuits boards. The two circuit boards are installed perpendicularly, with one parallel to the base while the other perpendicular. This design greatly reduces the problems of crosstalks and EMI. On the other hand, the base uses the design of a central beam, so that most of the circuit boards is exposed for convenient assembly and debugging. The base and the case are combined in a drawable way just like a matchbox. Therefore, invention can be easily assembled and difficult to be taken apart.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 3:
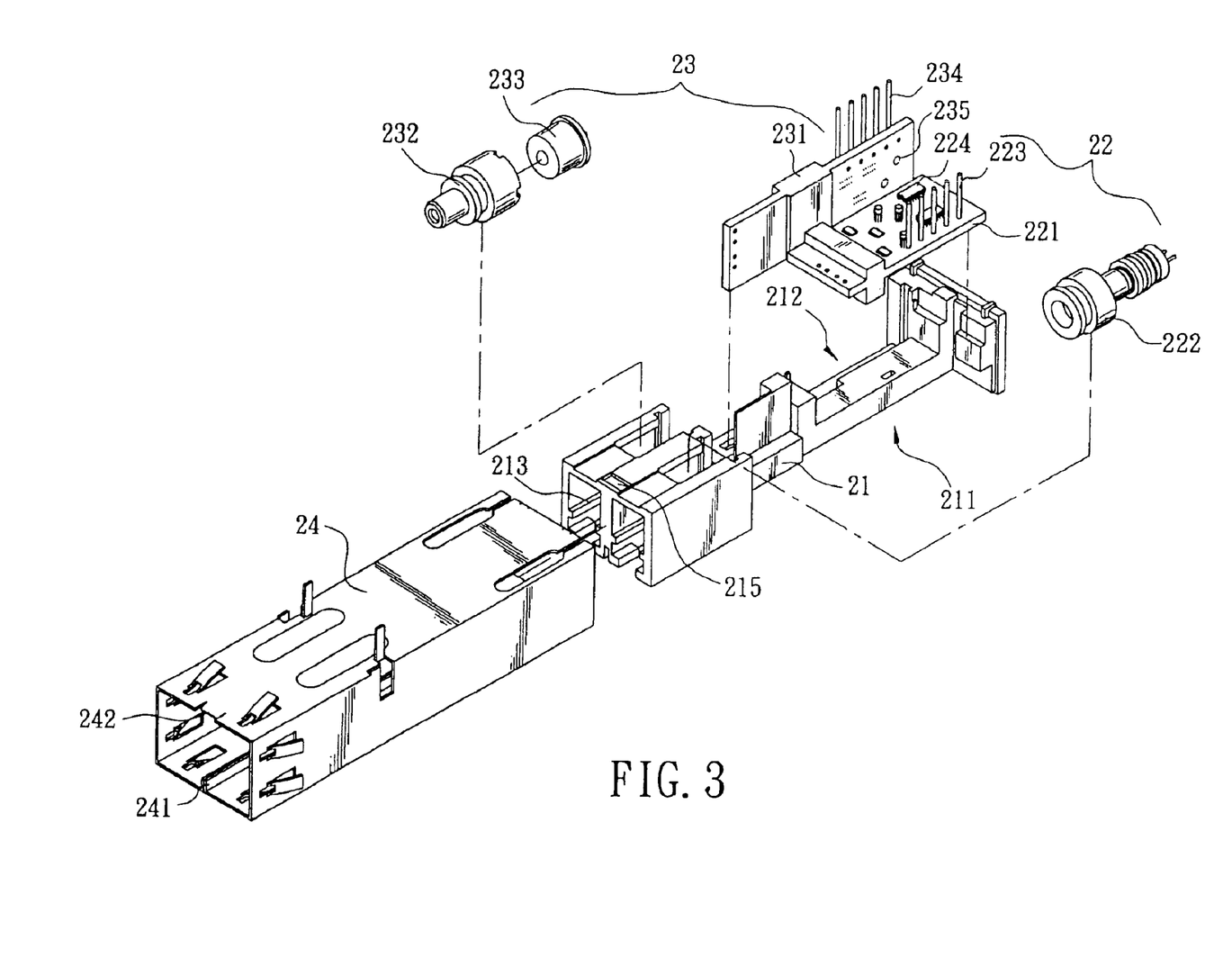
FIG. 3 is an explosive view of the invention.

According to the optical transceiver packaging method disclosed herein, it includes a base 21, a transmission 22, a receiving unit 23, and a case 24 (see FIG. 3). The transmission unit 22 and the receiving unit 23 have individual printed circuit boards, a transmission circuit board 221 and a receiving circuit board 231, or they can use only one printed circuit boards. The printed circuit board contains at least one opto-electronic module electrically connected thereon. The opto-electronic module contains a laser module 222 connected to the front end of transmission circuit board 221, electronic elements, a receptacle 232 and a detector 233. The transmission circuit board 221 has pins 223 and several electronic elements 224 50 that the transmission unit 22 is able to send out optical signals. Analogously, the receiving unit 23 contains a receiving circuit board 231 and a receptacle 232 and a detector 233 both connected to its front end. The receiving circuit board 231 also has pins 234 and several electronic elements 235 50 that the receiving unit 23 is able to receive optical signals.

Figure 4:
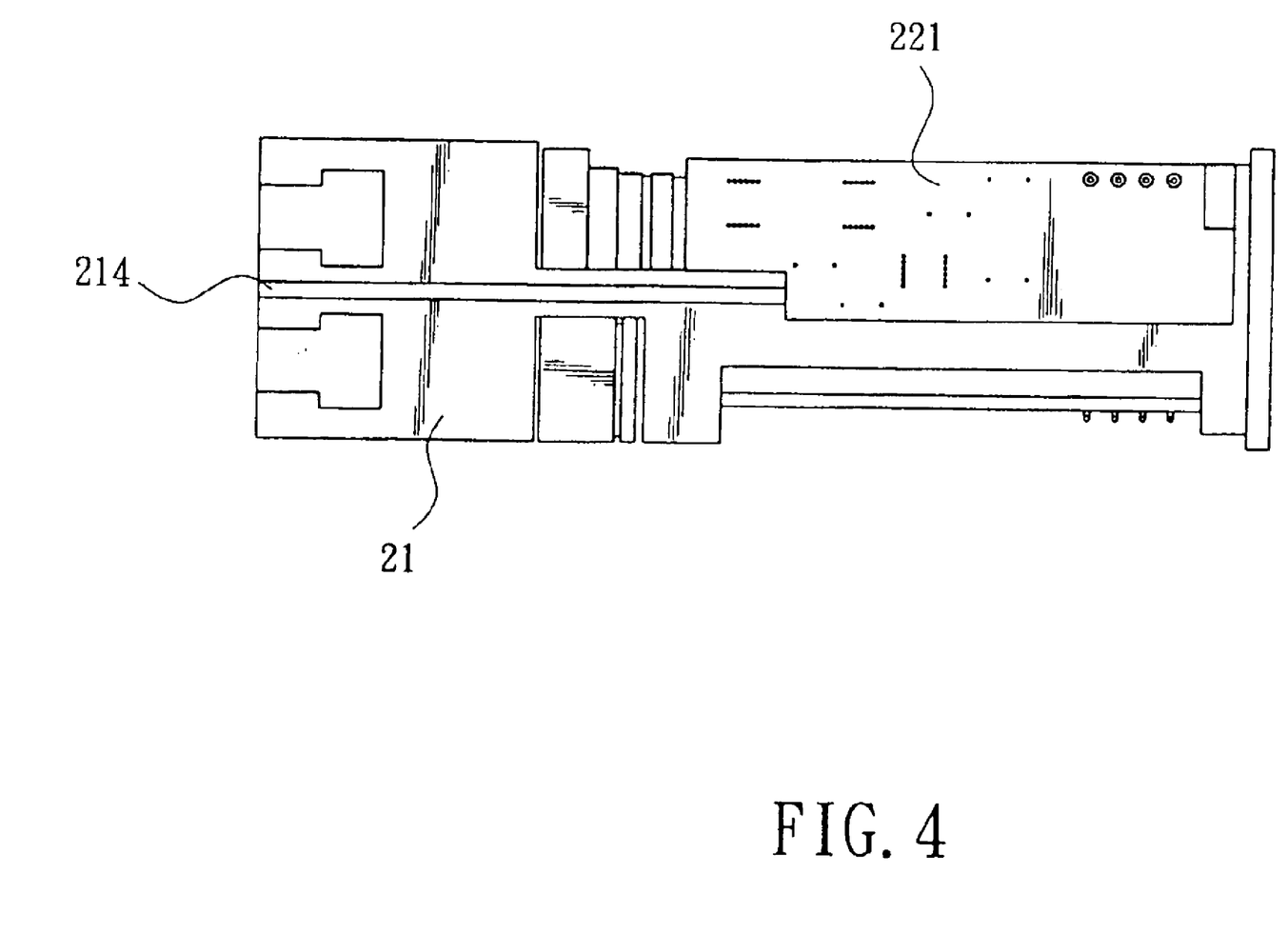
FIG. 4 is a schematic view of the central beam according to the invention.
Figure 5A:
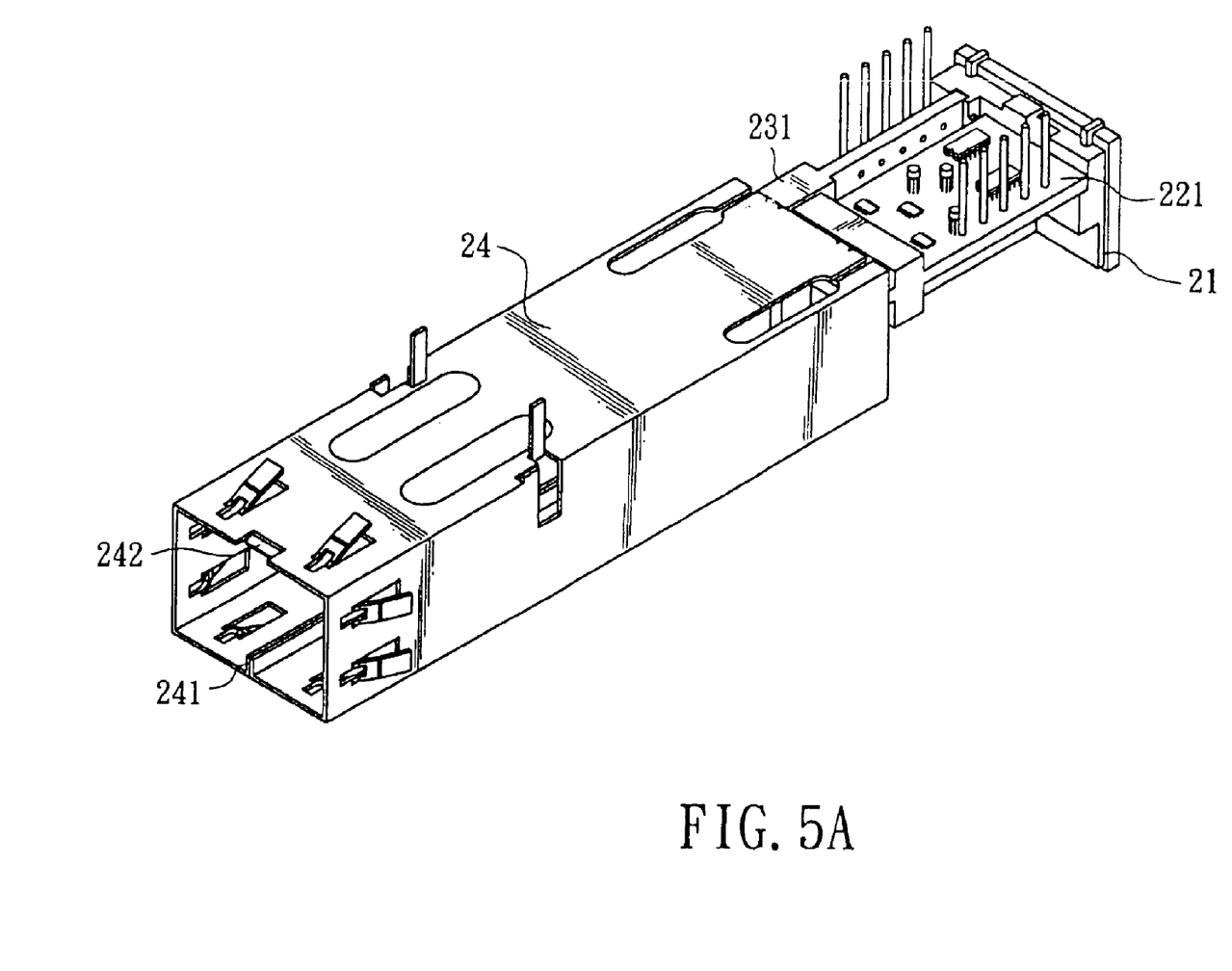
FIGS. 5A and 5B are two assembly views of the case.

The base 21 provides two fixing positions 211, 212 for the transmission unit 22 and the receiving unit 23, respectively. One of them is installed horizontally and the other vertically (FIG. 5A). In other words, the transmission circuit board 221 and the receiving circuit board 231 are perpendicular to each other. This reduces the crosstalks produced between the transmission unit 22 and the receiving unit 23 to its minimum. Owing to such a horizontal-vertical configuration, the internal space can be utilized with more flexibility and efficiently. Although not shown in the drawing, electric properties of the circuit or the metal shielding design thus become flexible. Moreover, the base 21 uses the design of a central beam. That is, a solid beam is provided only at the two fixing positions 211, 212. Such a design exposes most areas on the transmission circuit board 221 and the receiving circuit board 231 of the transmission unit 22 and the receiving unit 23, respectively. The connecting points or electronic elements thereon are thus not shielded. As shown in FIG. 4, the receiving circuit board 231 is vertical with no shielding on its left and right sides, while the transmission circuit board 221 is horizontal with no shielding above or beneath it. This is particularly convenient in assembly and testing in the manufacturing process.

The central beam design in the base 21 does not cover the soldering points and the elements at those points on the transmission circuit board 221 and the receiving circuit board 231. Therefore, it does not require additional text fixture. One only needs to directly place the transmission circuit board 221 and the receiving circuit bard 231 on the fixing positions 211, 212 on the base 21, followed by the soldering and solder the leads of TOSA and ROSA to circuit board. The front end of the base 21 is provided with connector sockets 213 for plugging the front end of the transmission unit 22 and the receiving unit 23, for guiding optic fiber connectors (not shown).

Figure 5B:
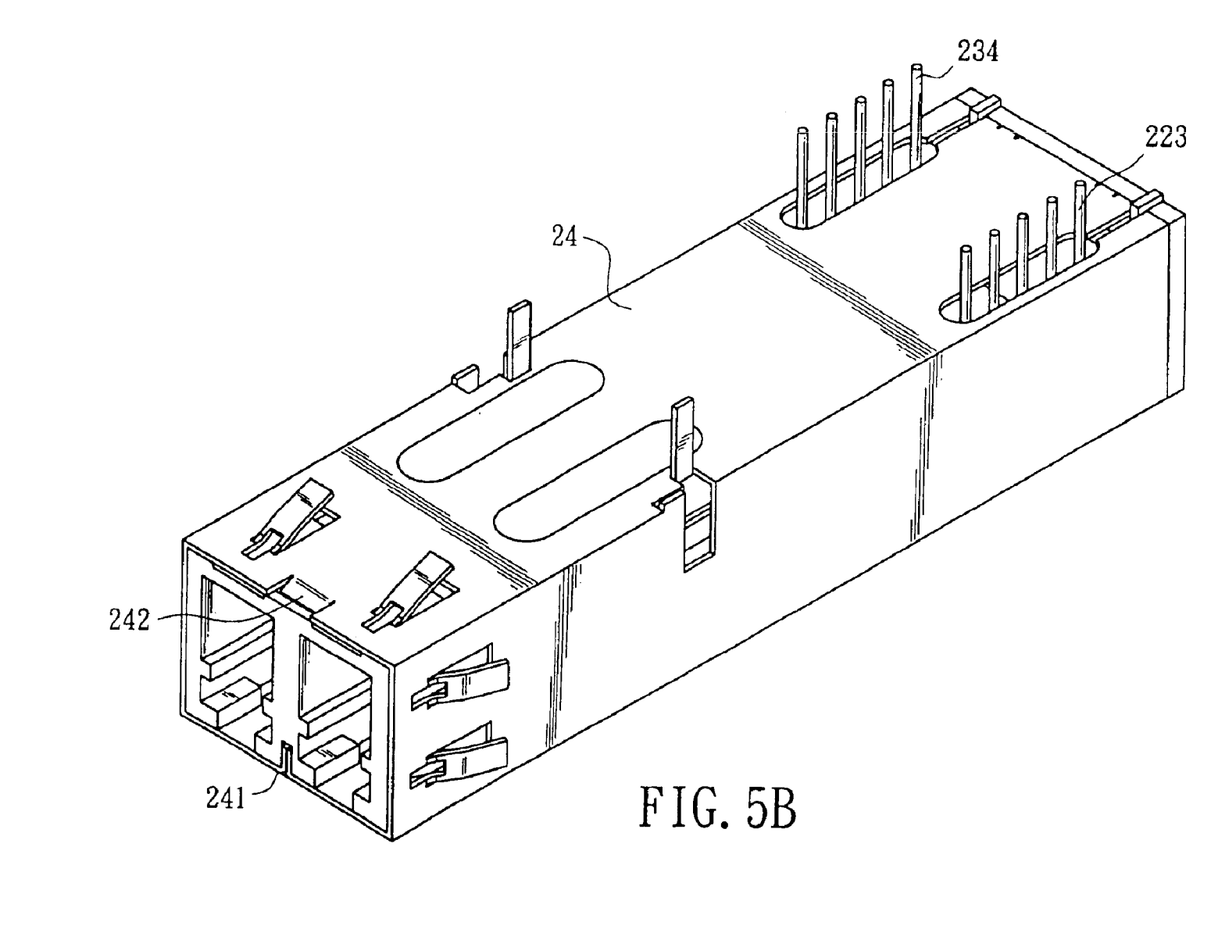

To meet the electromagnetic compatibility requirements, the case 24 can be made of metal. To minimize the number of elements and to facilitate assembly, the case 24 can be designed like a matchbox. Both front and rear ends of the case 24 are open so that the base 21 can be installed in the contained inside case 24. The inner side of its lower surface is formed with one sliding track 241, corresponding to a sliding groove 214 at the bottom of the base 21, so that the base 21 can be easily installed and fixed into the case 24 (see FIGS. 4 and 5A). The inner surface opposite to the sliding track 241 is a fixing part 242. After the base 21 is completely installed into the case 24, the fixing part 242 moves into a fixing hole 215 on the base 21 and holds the case 24 at this position, as shown in FIG. 5B.

Figure 6:
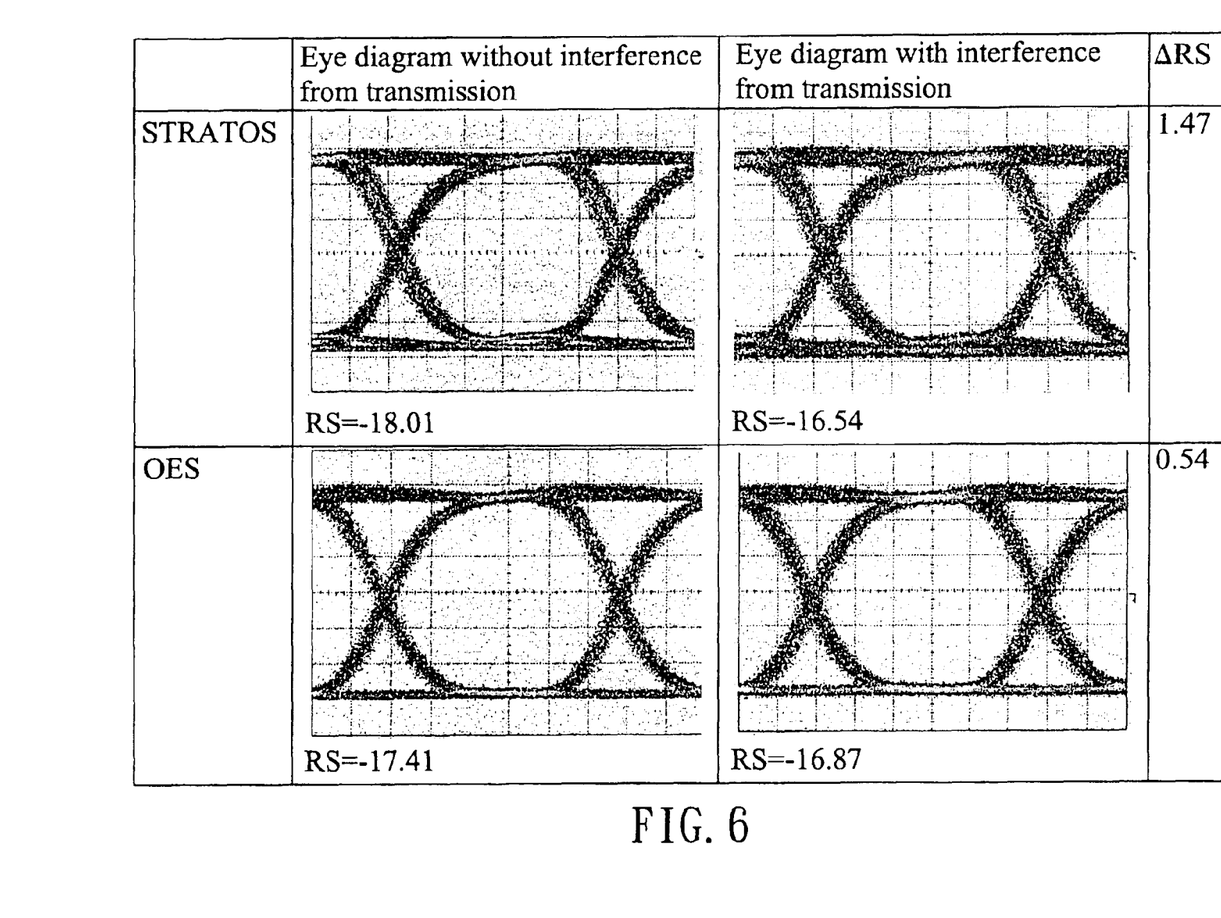
FIG. 6 compares the eye diagrams of the invention and the prior art.

Please refer to FIG. 6 for the crosstalk effects in the invention and the prior art. "OES" (the abbrevation for Opto electric and systems Laboratories in Industrial and Technology Research Institute) in the table refers to the invention. One can easily see the improvement on reducing the crosstalk.

Effects of the Invention

The invention discloses the assembly of an optical transceiver module. The transmission and receiving parts are designed as two independent circuit boards, installed perpendicular to each other on a base. Such a configuration can greatly reduce crosstalks and EMI. The base adopts the central beam design to expose most of the area on the circuit boards. This is particularly convenient for testing, adjusting and assembly. The case and the base are designed to match with each other so that the assembly is easy.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed:

1. A packaging for an optical transceiver module for an electronic device to receive and transmit optical signals, which comprises:
   a base;
   at least one printed circuit board being installed on the base;
   at least one opto-electronic module electrically connected to the printed circuit board for emitting/receiving optical signals; and
   a case covering and shielding around the base, the opto-electronic module and the printed circuit board wherein the case has a sliding track and the base has a sliding groove, the sliding track and the sliding groove matching each other so that the base is combined with the case by sliding into it.

2. The packaging of claim 1, wherein the printed circuit board contains a plurality of pins.

3. The packaging of claim 1, wherein the case has openings for pins of the printed circuit board to stick out of the case and to form an electrical connection with the electronic device.

4. The packaging of claim 1, wherein the base defines at least one fixing position for the printed circuit board installed thereon.

5. A packaging for an optical transceiver module for an electronic device to receive and transmit optical signals, which comprises:
   a base using a central beam design;
   at least one printed circuit board being installed on the base;
   at least one opto-electronic module electrically connected to the printed circuit board for emitting/receiving optical signals; and
   a case covering and shielding around the base, the opto-electronic module and the printed circuit board wherein the case has a sliding track and the base has a sliding groove, the sliding track and the sliding groove matching each other so that the base is combined with the case by sliding into it.

6. A packaging for an optical transceiver module for an electronic device to receive and transmit optical signals, which comprises:
   a base;
   at least one printed circuit board being installed on the base;
   at least one opto-electronic module electrically connected to the printed circuit board for emitting receiving optical signals;
   wherein the opto-electronic module connects the case directly; and
   a case covering and shielding around the base, the opto-electronic module and the printed circuit board wherein the case has a sliding track and the base has a sliding groove, the sliding track and the sliding groove matching each other so that the base is combined with the case by sliding into it.

7. The packaging of claim 1, wherein the base has connector sockets.

8. The packaging of claim 1, wherein the case has four sidewalls parallel to a longitudinal axis of the base to form a sleeve shape.

9. The packaging of claim 6, wherein the case has several holes on the sidewalls.

10. The packaging of claim 1, wherein the opto-electronic module comprises a plurality of electronic elements.

11. The packaging of claim 1, wherein the opto-electronic module comprises a laser module.

12. The packaging of claim 1, wherein the opto-electronic module comprises a receptacle and a detector.

13. The packaging of claim 5, wherein the printed circuit board contains a plurality of pins.

14. The packaging of claim 5, wherein the case has openings for pins of the printed circuit board to stick out of the case and to form an electrical connection with the electronic device.

15. The packaging of claim 5, wherein the base defines at least one fixing position for the printed circuit board installed thereon.

16. The packaging of claim 5, wherein the base has connector sockets.

17. The packaging of claim 5, wherein the case has four sidewalls parallel to a longitudinal axis of the base to form a sleeve shape.

18. The packaging of claim 6, wherein the case has openings for pins of the printed circuit board to stick out of the case and to form an electrical connection with the electronic device.

19. The packaging of claim 6, wherein the base defines at least one fixing position for the printed circuit board installed thereon.

20. The packaging of claim 6, wherein the base has connector sockets.

21. The packaging of claim 6, wherein the case has four sidewalls parallel to a longitudinal axis of the base to form a sleeve shape.

22. The packaging of claim 6, wherein the opto-electronic module comprises a plurality of electronic elements.

23. The packaging of claim 6, wherein the opto-electronic module comprises a laser module.

24. The packaging of claim 6, wherein the opto-electronic module comprises a receptacle and a detector.

\* \* \* \* \*